United States Patent
Chang et al.

(10) Patent No.: US 6,258,699 B1
(45) Date of Patent: Jul. 10, 2001

(54) LIGHT EMITTING DIODE WITH A PERMANENT SUBTRATE OF TRANSPARENT GLASS OR QUARTZ AND THE METHOD FOR MANUFACTURING THE SAME

(75) Inventors: Kuo-Hsiung Chang, Tao-Yuan Hsien; Kun-Chuan Lin, Taipei; Ray-Hua Horng, Chang-Hua Hsien; Man-Fang Huang, Hsinchu Hsien; Dong-Sing Wuu, Hsinchu; Sun-Chin Wei, Yung-Kuang; Lung-Chien Chen, Pa-Te, all of (TW)

(73) Assignee: Visual Photonics Epitaxy Co., Ltd., Taoyuan (TW)

( * ) Notice: Subject to any disclaimer, the term of this patent is extended or adjusted under 35 U.S.C. 154(b) by 0 days.

(21) Appl. No.: 09/307,681

(22) Filed: May 10, 1999

(51) Int. Cl.[7] .................................................. H01L 21/30
(52) U.S. Cl. ..................... 438/458; 438/455; 438/125; 438/46; 438/26; 414/935; 206/710
(58) Field of Search ............................... 438/22, 29, 26, 438/33, 46, 125, 455, 458; 414/935; 206/710, 832

(56) References Cited

U.S. PATENT DOCUMENTS

| | | |
|---|---|---|
| 4,570,172 | 2/1986 | Henry et al. . |
| 5,008,718 | 4/1991 | Fletcher et al. . |
| 5,233,204 | 8/1993 | Fletcher et al. . |
| 5,237,581 | 8/1993 | Asada et al. . |
| 5,376,580 | 12/1994 | Kish et al. . |
| 5,403,916 * | 4/1995 | Watanabe et al. ................... 437/127 |
| 5,895,225 * | 4/1999 | Kidoguchi et al. .................... 438/47 |
| 5,953,581 * | 9/1999 | Yamasaki et al. .................... 438/22 |
| 5,985,687 * | 11/1999 | Bowers et al. ........................ 438/46 |
| 6,015,719 * | 1/2000 | Kish, Jr. et al. ...................... 438/29 |

\* cited by examiner

*Primary Examiner*—Eddie C. Lee
*Assistant Examiner*—N. Drew Richards

(57) ABSTRACT

A method of manufacturing a light emitting diode (LED) includes growing a light emitting region on a temporary substrate, bonding a transparent substrate of glass or quartz to the light emitting region and then removing the temporary substrate. A metal bonding agent also serving as an ohmic contact layer with LED is used to bond the transparent substrate to form a dual substrate LED element which is then heated in a wafer holding device that includes a graphite lower chamber and a graphite upper cover with a stainless steel screw. Because of the different thermal expansion coefficients between stainless and graphite, the stainless steel screw applies a pressure to the dual substrate LED element during the heating process to assist the bonding of the transparent substrate.

10 Claims, 7 Drawing Sheets

LIGHT EMITTING DIODE WITH A PERMANENT SUBTRATE OF TRANSPARENT GLASS OR QUARTZ AND THE METHOD FOR MANUFACTURING THE SAME

FIELD OF INVENTION

The present invention relates to a light emitting diode with a permanent substrate of transparent glass or quartz and the method for manufacturing the same.

BACKGROUND OF INVENTION

The trend of current light emitting diode of visible light is that the intensity of illumination of light emitting diode is more and more stronger, while the volume is more and more compact.

U.S. Pat. Nos. 5,008,718 and 5,233,204 disclosed a light emitting diode with a transparent window layer. By this kind of light emitting diode, the crowding effect occurring in the conventional light emitting diode is reduced, wherein the current spread to emit light from the light emitting diode is increased. As a result, the illumination of the light emitting diode is apparently enhanced.

Moreover, U.S. Pat. No. 5,237,581 and No. 4,570,172 disclosed a light emitting diode having a semiconductor multilayer reflector, namely, DBR (distributed Bragg Reflector). By this light emitting diode, the light transmitting to the substrate is reflected backwards so as to penetrate through the light emitting diode. Accordingly, the light illumination of the light emitting diode is increased.

A cross sectional view of a conventional light emitting diode is illustrated in FIG. 1. The light emitting diode 100 includes a semiconductor substrate 102, a second ohmic contact electrode 101 formed on the rear side of the semiconductor substrate 102, a light generating region 103 formed on the semiconductor substrate 102, and a first ohmic contact electrode 106 formed on the light generating region 103. Because of the current crowding effect, critical angle of the emitting light and light absorption of the substrate, the illumination in this light emitting diode is not suitable. The light generating region 103 is formed by a P type region and an N type region, and then the light generating region 103 is grown on the gallium arsenide substrate 102. Therefore, the crystal lattice constants in most of the light generating region 103 are matched with that of the gallium arsenide substrate. Namely, the light emitting diode of visible light is directly fabricated on the gallium arsenide substrate 102. However, since the energy gap of the gallium arsenide is 1.43 eV which is smaller than that of the visible light and the light emitted from the diode is non-isotropic, part of the light enters the substrate and is absorbed by the gallium arsenide. U.S. Pat. Nos. 5,008,718 and No. 5,233,204 disclosed a transparent window layer structure for increasing the output light of a light emitting diode. Referring to FIG. 2, the structure of the light emitting diode 200 is formed by a transparent window layer 204 is grown on the light emitting diode 100 shown in FIG. 1. The proper material suitable for the transparent window layer 204 includes GaP, GaAsP, and AlGaAs, etc., whose energy gap is larger than those of the materials in the AlGaInP light generating region. Under this condition, the optic critic angle can be increased and the current crowding effect is reduced so as to enhance the illumination of the light emitting diode. However, in the electric property, since the materials on the uppermost layer of the transparent window layer 204 and the AlGaInP light generating region have a hetero junction, the energy gap difference causes the positive foward bias voltage $V_f$ of the light emitting diode to increase. As a result, the power loss of using the light emitting diode is increased.

The U.S. Pat. Nos. 5.237,581 and 4,570,172 disclosed a light emitting diode 300 with a multilayer reflecting structure, as shown in FIG. 3. The structure of FIG. 3 includes a semiconductor substrate 302, a lower multilayer reflector 305 formed on the semiconductor substrate 302, a light generating region 303 formed on the lower multilayer reflector 305, an upper multilayer reflector 304 formed on the light generating region 303, a first ohmic contact electrode 306 on the upper multilayer reflector 304, and a second ohmic contact electrode 301 on the rear side of the semiconductor substrate 302. In this prior art light emitting diode, the lower multilayer reflector 305 serves to reflect 90% of the light emitted from the light generating region to the light absorption substrate, while the upper multilayer reflector serves to guide light to the upper surface of the light emitting diode. Therefore, the problem of light absorption by the substrate is improved, and the problem of bad illumination from enlarging the critical angle is also improved. However, since the multilayer reflector has many hetero junctions, the effect of energy gap difference is enlarged. As a consequence, although the aforesaid DBR structure disclosed in U.S. Pat. Nos. 5.237,581 and 4,570,172 can reflect the light impinging on the substrate by the DBR structure, the DBR has a high reflective index only for normal incident light (shown in D1 of FIG. 3), while for oblique incident light (such as D2, D3, and D4 shown in FIG. 3) the reflective index is very small. Thus it is only a slight improvement to the illumination of a light emitting diode in the visible light band. Whereas the DBR structure increase the cost and difficulty of growing the thin film epitaxial layer. U.S. Pat. No. 5,376,580 disclosed a light emitting diode with wafer bonding, wherein a gallium arsenide substrate serves as a temporary substrate to grow a light emitting diode structure (including a confinement layer, an active layer and another confinement layer). Then the light emitting diode structure is adhered to a transparent substrate, and the GaAs substrate is removed. Therefore, the light absorption by the substrate can be solved completely. Whereas the transparent substrate disclosed in the aforementioned U.S. Pat. No. 5,376,580 is made by GaP which is very expensive and has an orange color. The light from LED to the substrate has a slight color. Further, in high temperature, the GaP as a transparent substrate needs to be processed for a long period of time (about 600~700° C. for at least one hour), this results in a bad effect to the p-n junction of LED.

SUMMARY OF THE INVENTION

Accordingly, the object of the present invention is to provide a method for manufacturing a light emitting diode with a permanent substrate of transparent glass or quartz. Transparent glass or quartz is used as a permanent substrate, and metal is employed as a bonding agent. An LED element is adhered to the transparent glass. After being adhered, an etching agent serves to remove the GaAs substrate. Therefore, the problem of light absorption by the substrate is improved, and the problem of the p-n junction being affected by temperature is resolved completely. The illumination is doubled.

Another object of the present invention is to provide a light emitting diode with a permanent substrate of transparent glass or quartz. The light emitting region of the light emitting diode with a permanent substrate of transparent glass or quartz is a conventional light emitting region structure. For example, it may be light emitting region of dual hetero structures with an upper cladding layer/an active layer/a lower cladding layer, a light emitting region of a single hetero structure, or a light emitting structure of a homostructure. The permanent substrate of transparent glass of the present invention can be applied to all kinds of conventional light emitting region and thus it has wide applications.

A further object of the present invention is to provide a method for manufacturing a light emitting diode with a permanent substrate of transparent glass or quartz comprising the steps of selecting a temporary substrate so as to grow an LED light emitting region on the temporary substrate for forming an LED element; selecting a permanent substrate, and adhering the LED element to the permanent substrate by a metal bonding agent; removing the temporary substrate adhered by the permanent substrate/LED element by mechanic grinding or chemical etching; manufacturing a plane LED element with a substrate of permanent substrate; forming ohmic contact electrodes on the plane LED element. According to the present invention, the illumination of a light emitting diode is enhanced.

The other object of the present invention is to provide a wafer holding device used in a light emitting diode, wherein two materials with different thermal expansion coefficients provide pressures to the LED element and transparent substrate, and thus the applied force can be measured by a twisting spanner. The feature of the present invention is that stainless steel screws are used to replace a quartz sleeve. Since the heat expansion coefficient of the stainless steel is larger than that of graphite, in the process of high temperature fusion, the stainless steel applies force to the clamped object.

The various objects and advantages of the present invention will be more readily understood from the following detailed description when read in conjunction with the appended drawing.

DETAILED DESCRIPTION OF THE PREFERRED EMBODIMENT

Figure 5:
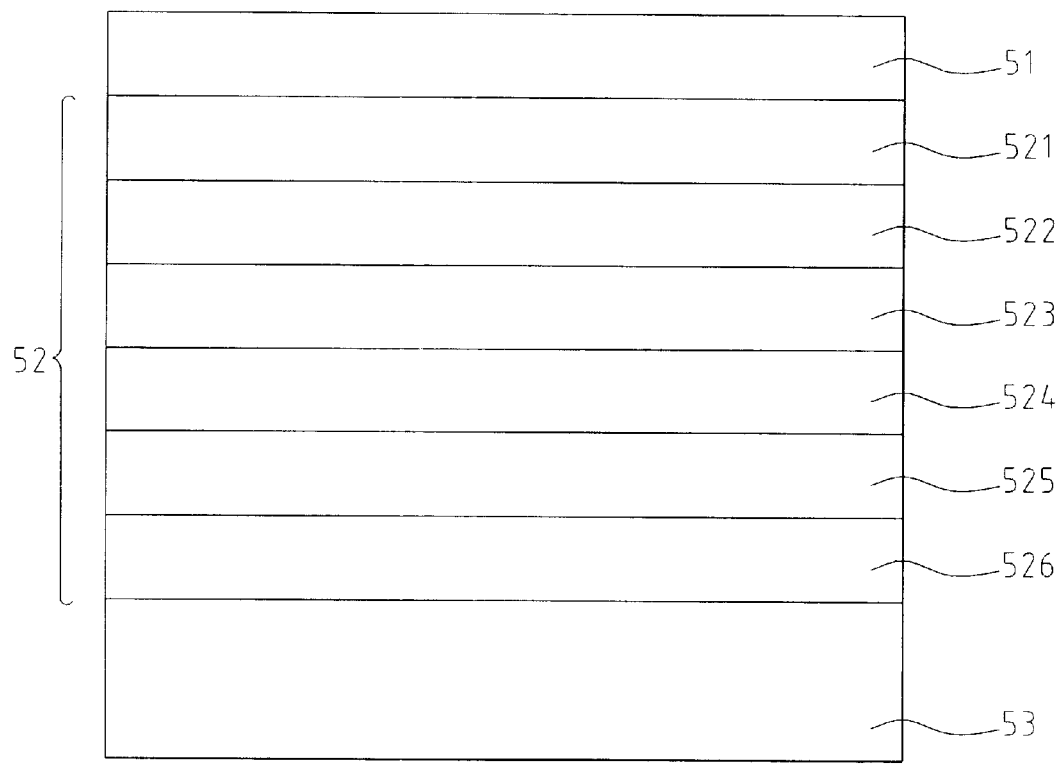
FIG. 5 is a cross sectional view of the LED element of one embodiment of the present invention.
Figure 6:
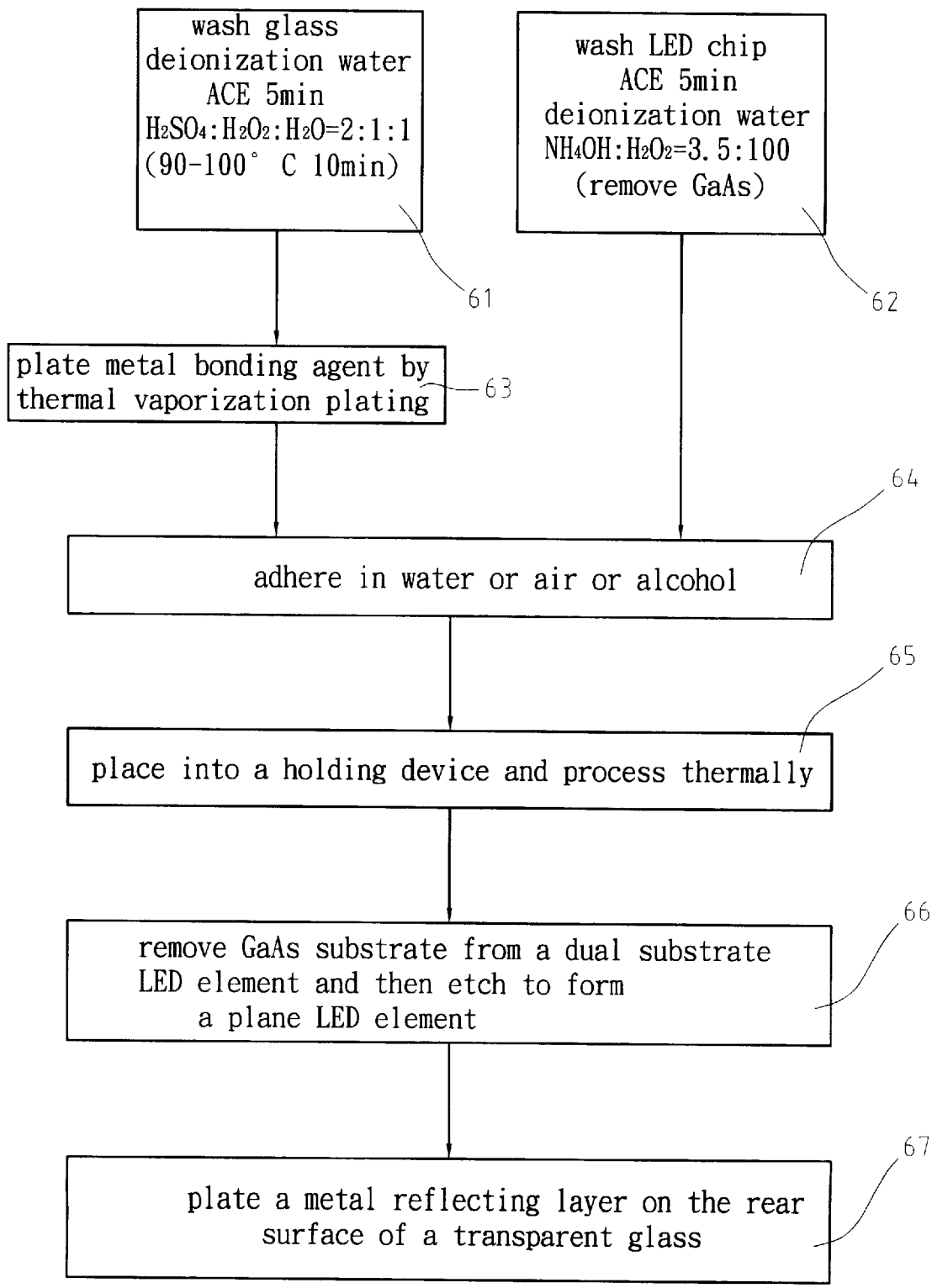
FIG. 6 shows the flow diagram of the LED element of the present invention being adhered to a transparent glass substrate.

In the present invention, at first, an LED element is deposited on a temporary substrate. Next, the LED element is adhered to a transparent glass that serves as a permanent substrate. Next, the temporary substrate is removed so that the light emitted from the LED element will not be absorbed by the substrate for enhancing the illumination of the emitted light. The LED element using the technology of the present invention is shown in FIG. 5. The flow diagram of the process for adhering the LED element to the transparent glass substrate is shown in FIG. 6.

Figure 1:
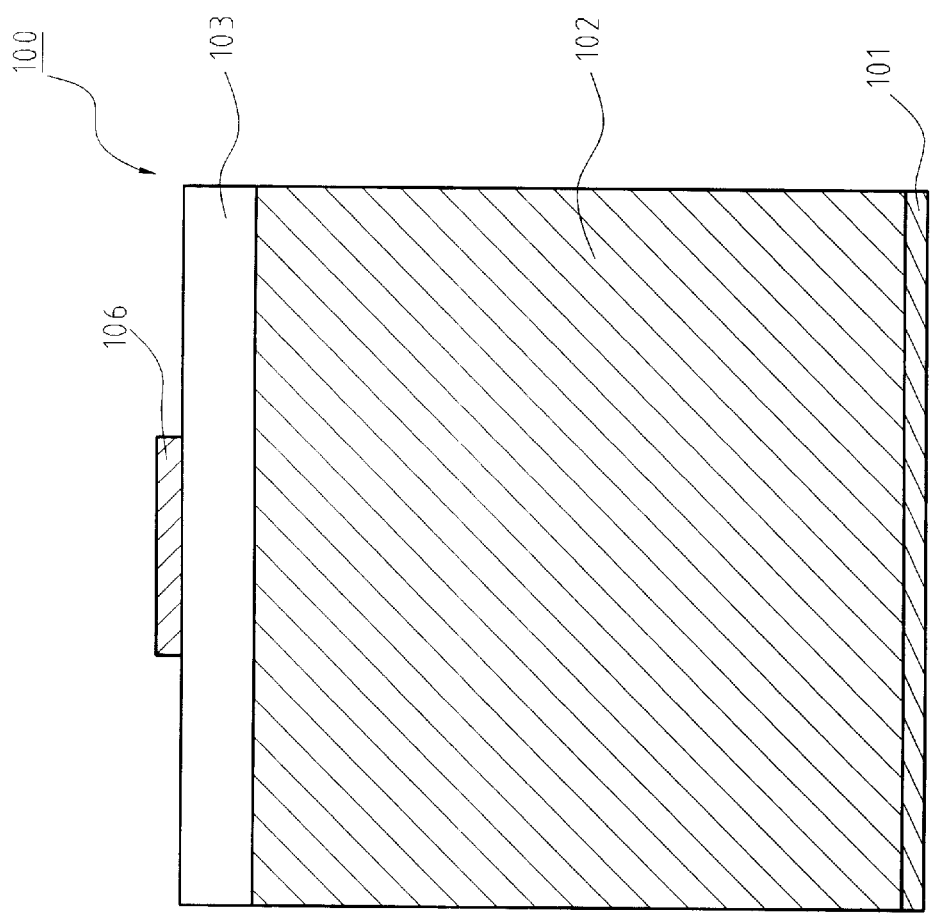
FIG. 1 is a cross sectional view of a conventional light emitting diode.
Figure 2:
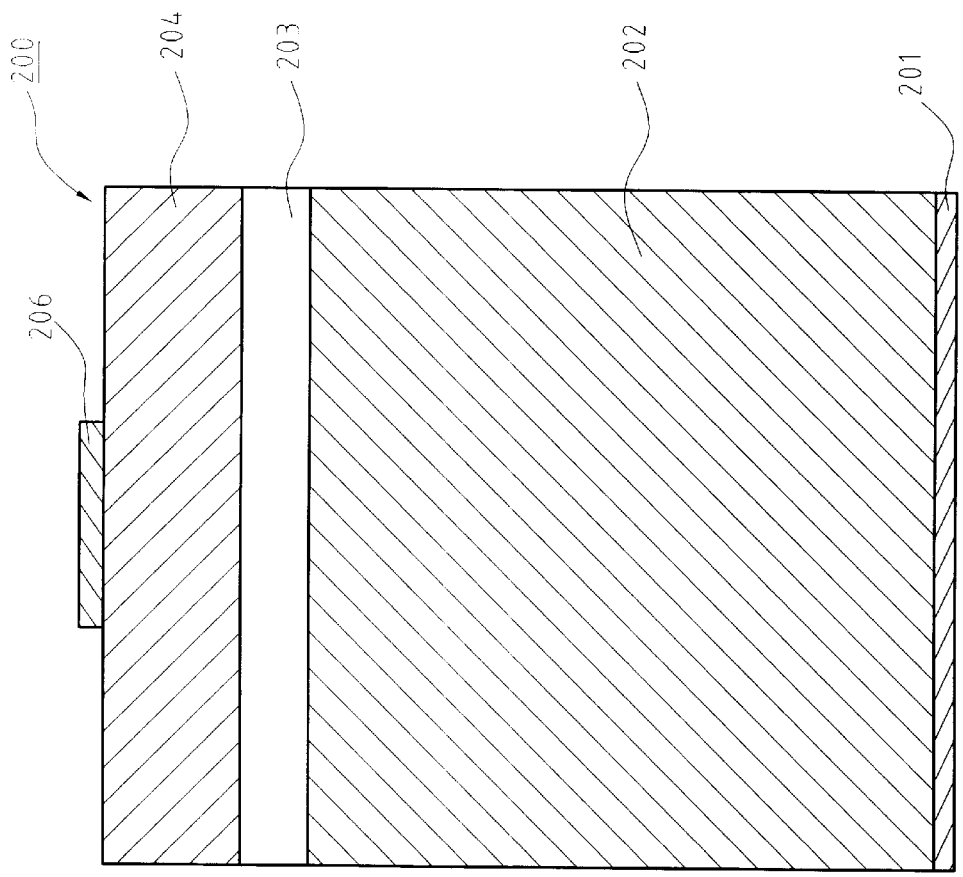
FIG. 2 is a cross sectional view of a conventional light emitting diode having a transparent window layer.
Figure 3:
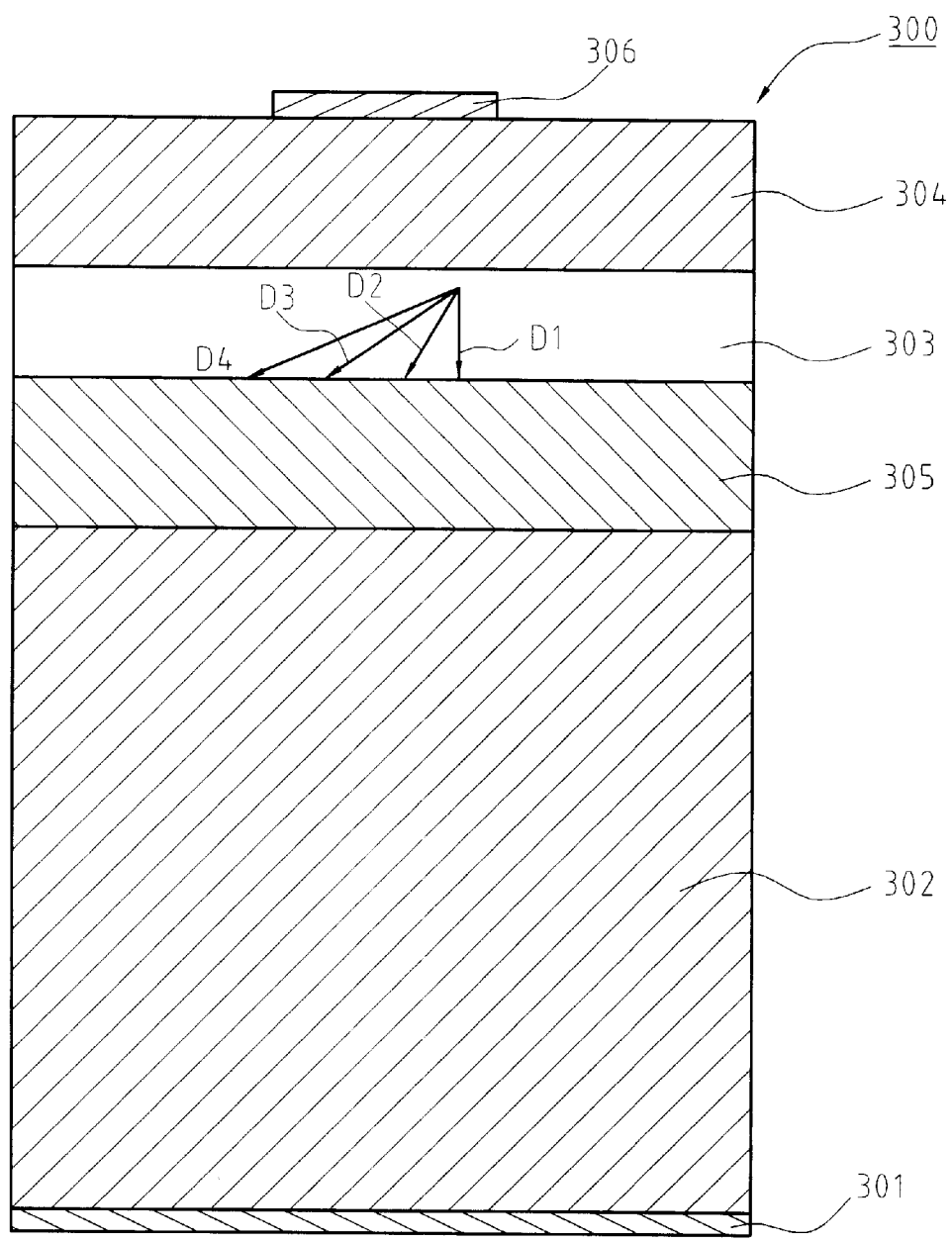
FIG. 3 shows a light emitting diode having a conventional multilayer reflector structure.
Figure 4A:
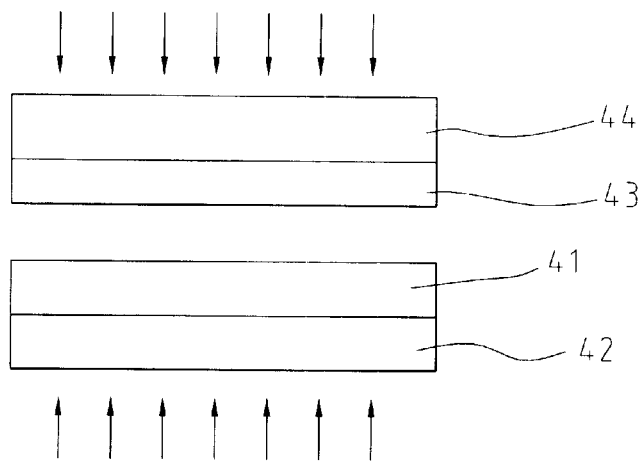
FIGS. 4A~4D are the flow diagram of manufacturing the light emitting diode of the present invention by adhering an LED element to a transparent glass or quartz substrate.
Figure 4B:
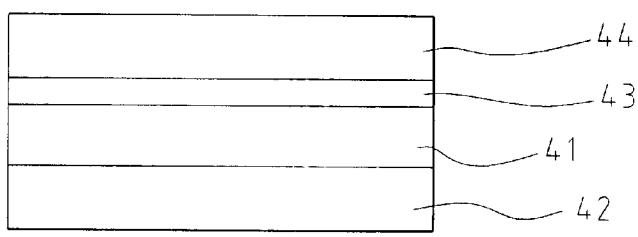
Figure 4C:
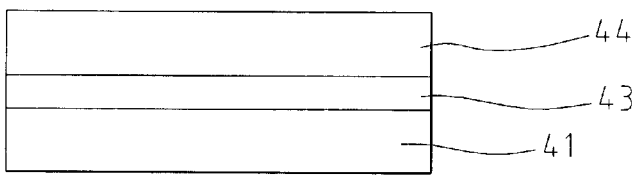
Figure 4D:
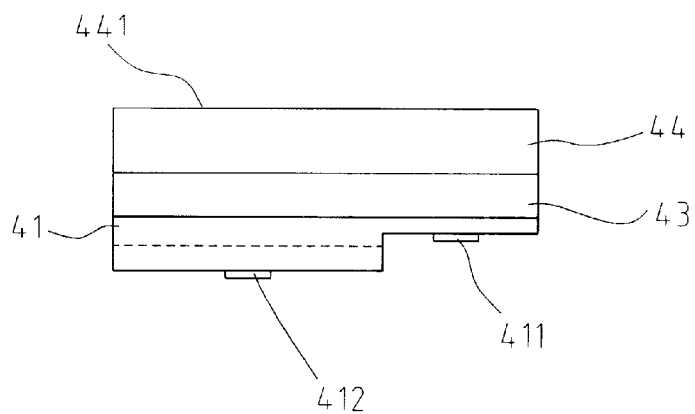

The manufacturing process in the present invention for an LED element with a permanent substrate of transparent glass or quartz comprises the steps of:

(A) Selecting a temporary substrate 42 to grow an LED light emitting region 41 on the temporary substrate 42 for forming an LED element as shown in FIG. 4A;

(B) Selecting a permanent substrate 44, and adhering the LED element to the permanent substrate 44 by a metal bonding agent 43 as shown in FIG 4B;

(C) Removing the temporary substrate 42 adhered to the permanent substrate 44 and LED element by mechanic grinding or chemical etching as shown in FIG. 4C; p1
(D) Manufacturing a plane LED element with a permanent substrate 44;

(E) Forming ohmic contact electrodes 411 and 412 on the plane LED element as shown in FIG. 4D;

(F) If the material of the metal bonding agent 43 is identical to that of the Ohm contact electrode 411, such as an alloy of gold and beryllium (AlBe), then etching the plane LED element 41 to the metal bonding agent 43 by chemical etching and substituting the ohmic contact electrode 411 with the metal bonding agent 43.

The aforesaid structure can further comprise the step of plating a metal reflecting layer on the rear side of the permanent substrate 44 for increasing illumination. The material of the metal reflecting layer is selected from the group of indium In, tin Sn, aluminum Al, gold Au, platinum Pt, titanium Ti, and silver Ag. The temporary substrate is selected from GaAs or InP. The permanent substrate is selected from glass or quartz. The metal bonding agent is selected from the group of alloys of beryllium and gold (AuBe), indium In, tin Sn, aluminum Al, gold Au, platinum Pt, titanium Ti, zinc Zn and silver Ag. The etching agent is formed from hydrochloric acid and phosphoric acid. The LED element may have a p/n junction or n/p junction. An etching stop layer 525 as shown if FIG 5 is formed between the LED light emitting region and the substrate so that the substrate can be removed effectively. The material of the etching stop layer is primarily formed by material resisting the etching liquid of the substrate and is different from that of the substrate, such as AlAs, InGaP or $Al_xGa_{1-x}As$.

The detailed steps of manufacturing the light diode according to the invention are described in the following:

(1) Adhering the LED elements (41 and 42) to the glass 44 or quartz by first washing the glass 44 or quartz; placing the glass 44 or quartz into acetone and then washing the glass or quartz by a supersonic oscillator for 5 minutes, removing the dust of the glass 44 or quartz, then washing the glass or quartz by $H_2SO_4$ under a temperature of 90~100° for about 10 minutes in order to remove the organic objects or heavy metal on the glass 44, and then plating the metal bonding agent 43 by vapor plating or electronic gun vapor plating. This metal serves as a sticky layer. In one embodiment of the present invention, the detailed structure of the LED element is illustrated in FIG. 5.

(2) Adhering the LED element by first washing the pollution on the surface of the LED element, then placing the glass 44 or quartz into acetone and then washing the glass or quartz by supersonic oscillator for 5 minutes to remove dust, thereafter, removing the oxidized layer on the surface of the LED element by diluted HF.

Figure 7:
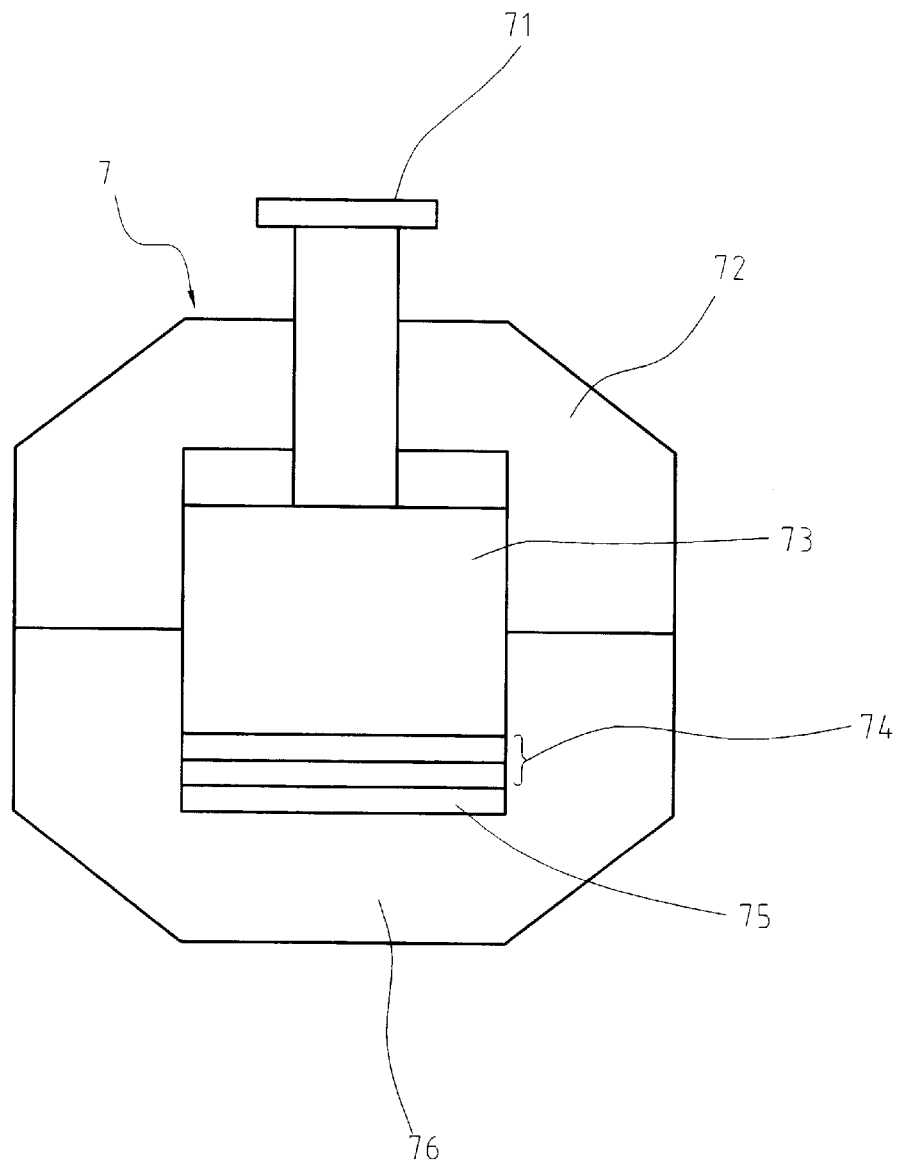
FIG. 7 is a cross sectional view of the wafer holding device of the present invention.

(3) Adhering the washed LED element to the glass 44 or quartz plated with the metal bonding agent 43 in air or alcohol, and then placing the LED element and the glass 44 or quartz plated with the metal bonding agent 43 to a holding device by a proper clamping device, with reference to FIG. 4A. The structure of the clamping device is shown in FIG. 7.

(4) Thermally processing the LED elements 41 and 42 and the glass 44 or quartz plated with metal bonding agent 43 under a temperature ranging from 300~450° C. for about 5~10 minutes, then naturally reducing the temperature, as shown in FIG. 4B.

(5) Removing the temporary GaAs substrate 42 on the processed sample (LED element and the glass or quartz plated with metal bonding agent 43) by mechanic grinding or a chemical etching agent ($NH_4OH:H_2O_2$) as shown in FIG. 4C.

(6) Patterning the p/n region of the LED element by an elective etching, namely, etching a p-type $(Al_{0.3}Ga_{0.7})In_{0.5}P$ or n-type$(Al_{0.3}Ga_{0.7})In_{0.5}P$ by $HCl:H_3PO_4$. Then, the structure shown in FIG. 4D is achieved.

(7) Forming plane electrodes 411 and 412, namely, forming ohmic contact electrodes of p-type$(Al_{0.3}Ga_{0.7})In_{0.5}P$ or n-type$(Al_{0.3}Ga_{0.7})In_{0.5}P$ (8) Plating a metal reflecting layer to the rear side of the adhered transparent glass formed as an LED element for enhancing the illumination of the LED element.

A cross sectional view of an embodiment of the present invention is illustrated in FIG. 5. The LED element comprises an n+ GaP bonding layer 51, a light emitting region 52 and a GaAs substrate 53. The thickness of the GaP is 0.1~1$\mu$m. The GaAs substrate may be an n+, p+ or SI-GaAs substrate. The light emitting region includes an n type $(Al_{0.3}Ga_{0.7})In_{0.5}P$ upper cladding layer 52 with a thickness of 0.5–1 $\mu$m a p type $(Al_{0.3}Ga_{0.7})In_{0.5}P$ active layer 522 with a thickness of 0.2–1 $\mu$m an n type $(Al_{0.3}Ga_{0.7})In_{0.5}P$ lower cladding layer 523 with a thickness of 0.5–1 $\mu$m a p+GaAs contact layer 524 with a thickness of 0.1 $\mu$m, an AlAs or InGaP etching stop layer 525 thickness of 0.1 $\mu$m, and a GaAs buffer layer 526. The LED light emitting region 52 has a p/i/n structure, and alternatively it may be an n/i/p structure. The n+ GaP only serves for the bonding layer and plane contact electrode, and, thus, the primary concern is not to destroy the mirror-like surface. AlAs serves as an etching stop layer and may be replaced by AlGaAs. If the doping concentration of p-$(Al_{0.3}Ga_{0.7})In_{0.5}P$ 523 is too high, then the n+ GaAs contact layer 524 may be eliminated so that light is not absorbed by GaAs.

The flow diagram of adhering LED elements to a substrate is shown in FIG. 6. A glass is washed firstly (step 61). Then, an LED wafer is washed (step 62). Next, the metal bonding agent is plated by thermal vaporizing plating (step 63). The LED element is adhered to the glass substrate in water, air or alcohol (step 64). The adhered structure is placed in a wafer holding device and thermally processed (step 65). The GaAs temporary substrate is removed from the dual substrate LED element and then it is etched to form a plane LED element (step 66). A metal reflecting layer is plated on the rear side of the transparent glass substrate (step 67).

The cross sectional view of the wafer holding device of the present invention is illustrated in FIG. 7. The wafer holding device includes a stainless steel screw 71, a graphite upper cover 72, a graphite pillar 73, a dual substrate LED element (i.e. glass and LED wafer) 74, a graphite shim 75, and a graphite lower chamber 76. In this wafer bonding holding device, by means of different thermal expansion coefficients of the two materials in the holding device, the two pieces of the dual substrate LED element are is pressed so as to be fused with each other in higher temperature. The feature of the holding device of the present invention is that a stainless steel screw serves to substitute for the quartz sleeve, since the thermal expansion coefficient of the stainless still is larger than that of graphite, during high temperature fusion, the stainless steel will apply a force.

The advantages and effects of the present invention are:

(1) In the present invention, transparent glass is used to replace the conventional light absorbing substrate (such as GaAs) or colored substrate (such as GaP), and the substrate of transparent glass is easily obtained. Therefore, the illumination and hue of the LED element are improved.

(2) In the present invention, the heating process is performed in lower temperature (about 300~450° C.) for about 5 to 10 minutes for providing the energy for adhering, thus the original pn junction of an LED is not affected. Further, the pollution and diffusion do not occur under such a lower temperature.

(3) In the present invention, a metal is used as the bonding agent. When transparent glass is used as a permanent substrate, a metal layer is plated to the rear side of the transparent glass for enhancing the intensity of the LED.

(4) The wafer holding device used in the present invention is shown in FIG. 7, wherein two materials with different thermal expansion coefficients provide pressures to the LED element and transparent substrate, and thus the applied force can be measured by a twisting spanner.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method for manufacturing a light emitting diode, comprising the steps of:

selecting a temporary substrate, growing an LED light emitting region on said temporary substrate and forming an LED element;

selecting a permanent substrate and plating a first side of said permanent substrate with a metal bonding agent;

adhering said light emitting region of said LED element to said permanent substrate by means of said metal bonding agent to form a dual substrate LED element;

placing said dual substrate LED element on top of a graphite shim in a graphite lower chamber of a wafer holding device;

placing a graphite pillar above said dual substrate LED element;

covering said wafer holding device with a graphite upper cover, said graphite upper cover having a stainless steel screw pressing said graphite pillar, and said stainless steel screw having a thermal expansion coefficient larger than the thermal expansion coefficient of graphite;

heating said dual substrate LED element in said wafer holding device, said dual substrate LED element being applied with a force because of thermal expansion of said stainless steel screw;

taking said dual substrate LED element out of said wafer holding device;

removing said temporary substrate from said dual substrate LED element to form a plane LED element;

patterning said light emitting region of said plane LED element; and forming two ohmic contact electrodes for said plane LED element.

2. The method for manufacturing a light emitting diode as claimed in claim 1, wherein heating said dual substrate LED element in said wafer holding device is accomplished at a temperature ranging from 300 to 450 degrees for about 5 to 10 minutes.

3. The method for manufacturing a light emitting diode as claimed in claim 1, wherein one of said two ohmic contact electrodes is formed by etching away a portion of said light emitting region to expose a portion of said metal bonding agent, said exposed metal bonding agent serving as an ohmic contact electrode.

4. The method for manufacturing a light emitting diode as claimed in claim 1, said temporary substrate comprising GaAs or InP.

5. The method for manufacturing a light emitting diode as claimed in claim 1, said permanent substrate comprising glass or quartz.

6. The method for manufacturing a light emitting diode as claimed in claim 1, said metal bonding agent comprising AuBe, In, Sn, Al, Au, Pt, Ti, Zn or Ag.

7. The method for manufacturing a light emitting diode as claimed in claim 1, further comprising a step of plating a metal reflecting layer on a second side of said permanent substrate for enhancing illumination of said light emitting diode.

8. The method for manufacturing a light emitting diode as claimed in claim 7, said metal reflecting layer comprising In, Sn, Al, Au, Pt, Ti or Ag.

9. The method for manufacturing a light emitting diode as claimed in claim 1, wherein said LED element formed on said temporary substrate includes an etching stop layer.

10. The method for manufacturing a light emitting diode as claimed in claim 9, said etching stop layer comprising AlAs, InGaP or $Al_xGa_{1-x}As$, $0.1 \leq x \leq 0.8$.

* * * * *